(12) United States Patent
Nakamura

(10) Patent No.: US 6,893,960 B2
(45) Date of Patent: May 17, 2005

(54) METHOD FOR MANUFACTURING A SEMICONDUCTOR DEVICE

(75) Inventor: Makiko Nakamura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/123,426

(22) Filed: Apr. 17, 2002

(65) Prior Publication Data

US 2003/0036260 A1 Feb. 20, 2003

(30) Foreign Application Priority Data

Aug. 14, 2001 (JP) .................................. 2001-245889

(51) Int. Cl.$^7$ .......................................... H01L 21/4763
(52) U.S. Cl. ................ 438/642; 438/637; 438/669; 438/672; 438/688; 438/700
(58) Field of Search ................ 438/642–644, 438/648, 669, 735–738, 744, 672, 622, 637, 638, 639, 640, 626, 624, 25, 666, 667, 668, 675, 687, 688, 696, 700–702

(56) References Cited

U.S. PATENT DOCUMENTS

| | | | | |
|---|---|---|---|---|
| 5,313,516 A | * | 5/1994 | Afshar et al. ............ | 379/88.24 |
| 6,015,751 A | * | 1/2000 | Liu ............................. | 438/637 |
| 6,097,094 A | * | 8/2000 | Ishigami ..................... | 257/763 |
| 6,114,766 A | * | 9/2000 | Shields ........................ | 257/758 |
| 6,492,257 B1 | * | 12/2002 | Shields et al. .............. | 438/622 |
| 6,576,547 B2 | * | 6/2003 | Li .............................. | 438/637 |

FOREIGN PATENT DOCUMENTS

| | | |
|---|---|---|
| JP | 01-296644 | 11/1989 |
| JP | 08-088227 | 4/1996 |
| JP | 10-107140 | 4/1998 |
| JP | 10-275859 | 10/1998 |
| JP | 11-214507 | 8/1999 |
| JP | 11-317454 | 11/1999 |

\* cited by examiner

*Primary Examiner*—Carl Whitehead, Jr.
*Assistant Examiner*—Thanhha Pham
(74) *Attorney, Agent, or Firm*—Volentine Francos & Whitt, PLLC

(57) ABSTRACT

A method for manufacturing a semiconductor device capable of forming a fine interconnection structure without making the resistance at the through hole high is provided. More specifically, a semiconductor device having a first interconnection formed on the surface of a first layer insulating film is provided, and a second interconnection is also provided on the upper part of the first interconnection and is electrically connected to the first interconnection, and wherein the first interconnection is formed so that the width of the lower part is narrower than that of the upper part.

2 Claims, 14 Drawing Sheets

MEASURING PATTERN

THsize : 0.26 μmφ

WIRING WIDTH : 0.26 μm PATTERN

METHOD FOR MANUFACTURING A SEMICONDUCTOR DEVICE

BACKGROUND OF THE INVENTION

1. Field of the Invention

The present invention relates to a method for manufacturing a semiconductor device. More specifically, the present invention relates to a method for manufacturing a semiconductor device in which a through hole to open a hole on the upper surface of interconnection and the side part thereof is formed.

2. Related Art

A method for manufacturing a semiconductor device with a multi-layer interconnection structure in which a conventional Al interconnection is used in reference to FIGS. 11 and 12. It is to be noted that FIGS. 11 and 12 are sectional process charts showing a conventional method for manufacturing a semiconductor device.

First, a lower layer interconnection 601 is formed on an insulating film 600 of a semiconductor substrate as shown in FIG. 11(a). Next, a through hole 603 is opened by photography or etching method after a layer insulating film 602 is formed on the whole surface of the lower layer interconnection 601 and flattened by CMP (Chemical Mechanical Polishing) method as shown in FIG. 11(b).

Further, a tungsten film (hereafter, referred to as W film) 605 is formed to fill in the through hole by, e.g., CVD (Chemical Vapour Deposition) method after an adherent layer 604 composed mainly of titanium nitride (hereafter, referred to as TiN) and titanium (hereafter, referred to as Ti) is formed by spattering or CVD method as shown in FIG. 11(c).

And then the metal layer (W film) 605 and the adherent layer 604 which cover other than inside of the through hole are removed by CMP method or by etching back as shown in FIG. 12(a). Finally, an upper layer interconnection 606 is formed as shown in FIG. 12(b).

As described above, since a conventional lower layer interconnection is usually large enough to cover all the through holes, the through hole can be formed on the upper surface of the lower layer interconnection without exception.

However, with the recent progress in making a design rule detailed, it has become difficult to form a lower layer interconnection large enough to cover all the through holes. For this reason, it has become necessary to form the through hole not only on the upper surface of the lower layer interconnection but also at the sidewall of a interconnection. For example, the through hole is formed at the end part of an extremely fine interconnection as shown in FIG. 13.

In the conventional interconnection structure, it was observed that the larger the amount of over-etching becomes in opening a through hole the higher the resistance at the through hole becomes as shown in FIG. 14. However, since the opening area of the lower layer interconnection does not usually become small even if the amount of over-etching is increased, it is impossible for the resistance at the through hole to rise.

The inventors have recognized that the above phenomenon has been caused by the sidewall of the lower layer interconnection was exposed on a plasma gas during the over-etching with the through hole formed on the sidewall of the lower layer interconnection. Considering this fact, we can understand that the resistance at the through hole rises with the following reason. Non-conductive reaction product (for example, fine particle such as aluminum fluoride and aluminum nitride) is formed as a material exposed on the sidewall of the lower layer interconnection (for example, an aluminum-based material) reacts with an etching gas (for example, fluorine-based gas and nitride-based gas), and the reaction product accumulates on the lower layer interconnection with, for example, an etching gas convection.

We can also understand that the interfacial resistance with the aluminum-based material rises since carbon-based gas or nitride-based gas is generated as the etching gas reacts at the sidewall of the exposed interconnection and the grain boundary at a titanium nitride film (hereafter, referred to as TiN film) at the bottom of the through hole is spread.

By the way, there is a need to achieve the over-etching at more than several hundreds of nanometers to obtain a good electrical conduction between all the interconnection patterns and through holes since the layer insulating film flattened by CMP method does not have a uniform thickness due to the density difference of interconnection pattern. For this reason, the amount of over-etching becomes excessive at a shallow through hole formed on a thin layer insulating film, and the resistance becomes high.

As described above, a method for forming a through hole without reacting the etching gas at the sidewall of the interconnection is desired.

Therefore, the object of the present invention is to provide novel and improved method for manufacturing a semiconductor device capable of forming a fine interconnection structure without making the resistance at the through hole high.

SUMMARY OF THE INVENTION

In the typical present invention to achieve the above object, there is provided a method for manufacturing a semiconductor device forming a first interconnection formed on the surface of a first layer insulating film and a second interconnection provided on the upper part of the first interconnection and electrically connected to the first interconnection and comprising: forming the first interconnection so that the width of the lower part may become narrower than that of the upper part; and forming a second layer insulating film to cover the first interconnection.

In the present invention, since the first interconnection is formed so that the width of the lower part may become narrower than that of the upper part, a through hole is formed with the sidewall of the lower layer interconnection covered with the layer insulating film. Consequently, an etching gas can be prevented from reacting at the sidewall of the lower layer interconnection and especially the resistance at a shallow through hole formed with a fine pitch can be prevented from being made high.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

Figure 1A:
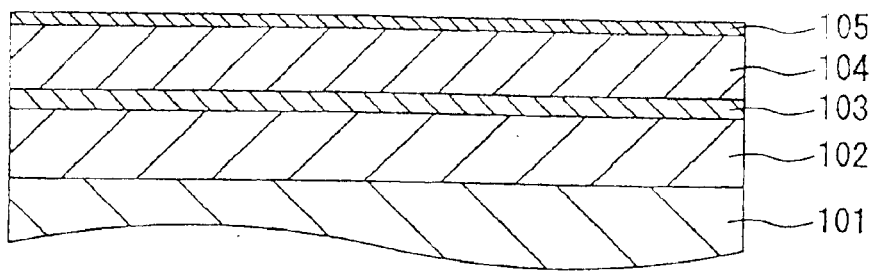
FIGS. 1(a)–1(c) are sectional process charts showing a method for manufacturing a semiconductor device in the first embodiment.

Hereinafter, the preferred embodiment of the present invention will be described in reference to the accompanying drawings. Same reference numerals are attached to components having same functions in following description and the accompanying drawings, and a description thereof is omitted.

First Embodiment

A method for manufacturing a semiconductor device in the first embodiment will be explained in reference to FIGS. 1 and 2. It is to be noted that FIGS. 1 and 2 are sectional process charts showing a method for manufacturing a semiconductor device in the first embodiment.

First, as shown in FIG. 1(a), after a silicon oxide film 102 is formed on a semiconductor substrate 101 on which a transistor (not shown), for example, is formed, a first laminated film 103 composed of a titanium (hereafter, referred to as Ti) film with the film thickness of, for example, 20 nm and a titanium nitride (hereafter, referred to as TiN) film with the film thickness of, for example, 20 nm, an aluminum (hereafter, referred to as Al)—copper (hereafter, referred to as Cu) alloy film 104 with the film thickness of, for example, 400 nm, and a second laminated film 105 composed of, for example, a Ti film with the film thickness of, for example, 5 nm and a TiN film with the film thickness of, for example, 50 nm, are formed in order. And a lower layer interconnection is formed.

Figure 1B:
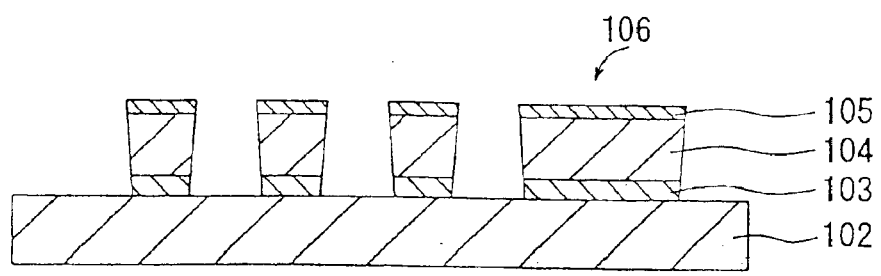

It is preferable for the sidewall of the lower layer interconnection to take an inverse tapered shape having an angle of 86–88 degrees by patterning of, for example, photolithography or etching method in order to obtain the effect of the present invention as shown in FIG. 1(b).

The lower layer interconnection with an inverse tapered shape can be formed by the following method. The radio frequency (RF) power is set at, for example, 90 W and the microwave power is set at a little more than the conventional one (for example, 500 W), by using an etching gas composed of, for example, boron trichloride (hereafter, referred to as $BCl_3$), chlorine (hereafter, referred to as $Cl_2$) and argon (hereafter, referred to as Ar). On the other hand, the lower layer interconnection with an inverse tapered shape can be formed by, for example, increasing the amount of adding chlorine gas (hereafter, referred to as $Cl_2$ gas) or by setting the film thickness of resist film thinner (for example, 14,000 angstroms) than the conventional one (for example, 18,000 angstroms) to accelerate the etching at the sidewall of lower layer interconnection.

In addition, when the lower layer interconnection is formed by using an etching gas containing, for example, carbon monoxide (hereafter, referred to as CO), which is effective in forming an organic film (for example, carbon-based deposition) to protect the sidewall of the lower layer interconnection from an etching gas, the lower layer interconnection with an inverse tapered shape can be formed by, for example, refraining from adding CO gas to reduce the carbon deposition formed at the sidewall of the lower layer interconnection and to accelerate the etching at the sidewall of lower layer interconnection.

Figure 1C:
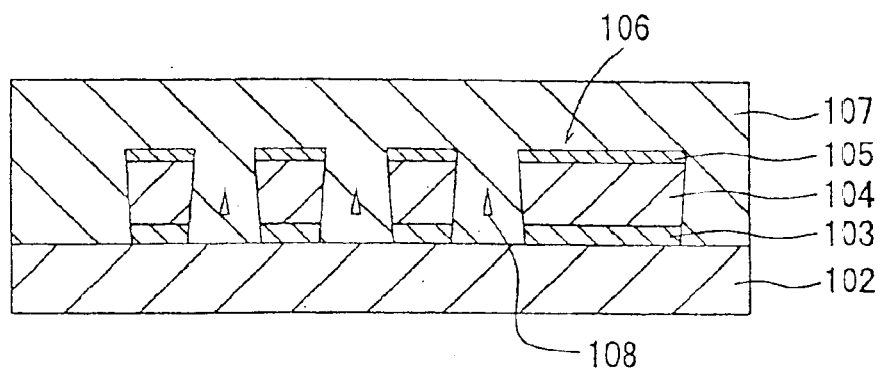

Next, as shown in FIG. 1(c), after a layer insulating film 107 composed of, for example, silicon oxide film is formed by high-density plasma CVD method, the surface of the layer insulating film 107 is flattened by, for example, CMP method. At this time, the layer insulating film does not have a uniform thickness due to the density difference of interconnection pattern.

Also in the case of the lower layer interconnection 106 with an inverse tapered shape, since the gap on the upper side part between the lower layer interconnections becomes narrower than the gap at the bottom side part between the lower layer interconnections, each part of the layer insulating film in the gap comes into contact with each other on the upper side part between the lower layer interconnections before the layer insulating film is completely filled in the gap. For this reason, a void 108 is usually generated in the middle of the lower layer interconnection 106. As described above, when the interconnection is formed in an inverse tapered shape, a void remains in the layer insulating film of the interconnection even if a method in which the void is hard to generate conventionally, by a high density CVD method for example, is utilized. However, we have recognized by practice that since the taper angle at the lower layer interconnection is set at 86–88 degrees, the size of the void is approximately at a maximum of 0.03 μm when the film thickness of the lower layer interconnection film is, for example, 0.5 μm. In this case, even if displacement between the through hole and the lower layer interconnection generates to some degree, a tungsten plug (hereafter, referred to as W plug) does not contact with the void. When a coating system low-dielectric constant material with a dielectric constant of less than 4.0 for example, is utilized as the material of the layer insulating film, the filling-in condition of the layer insulating film in which the void is not generated can be set since a liquid constituent is filled in little by little from the bottom.

Figure 2A:
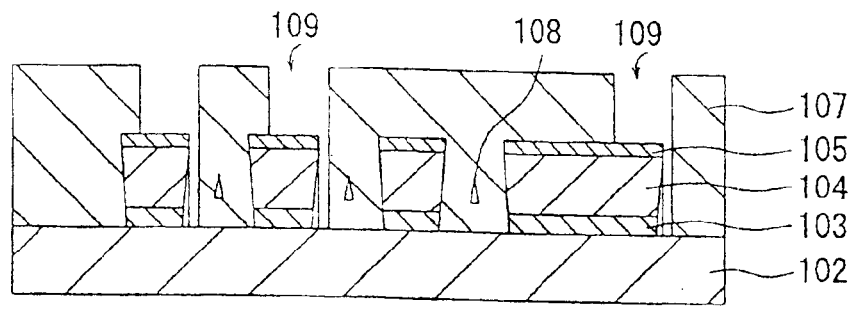
FIGS. 2(a)–2(c) are sectional process charts showing a method for manufacturing a semiconductor device in the first embodiment.

Further as shown in FIG. 2(a), a through hole 109 is formed on the layer insulating film 107 by photolithography method or anisotrophic etching method in which an etching gas composed of, for example, carbon tetrafluoride (hereafter, referred to as $CF_4$), oxygen (hereafter, referred to as $O_2$) and Ar so as to open the upper surface of the lower layer interconnection and a specific region on the side thereof. At this time, since the layer insulating film does not have a uniform thickness due to the density difference of interconnection pattern, it becomes necessary to over-etch the lower layer interconnection so as to form a through hole to make the whole surfaces of the lower layer interconnection exposed. In addition, the second laminated film 105 is made to remain at the bottom of the through hole.

In this embodiment, since the lower layer interconnection is formed in an inverse tapered shape, the through hole is opened vertically and the sidewall of the lower layer interconnection is not exposed to oxide film etching gas even if the lower layer interconnection is over-etched to the part near the bottom thereof.

Figure 2B:
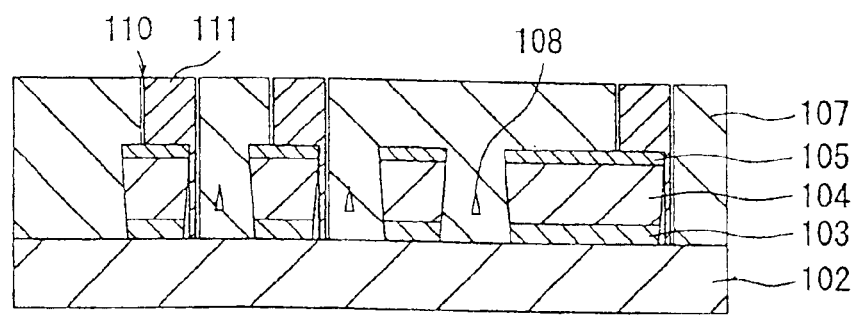

Furthermore as shown in FIG. 2(b), after the bottom of the through hole is cleaned by an etching method with, for example, the spattering of an argon ion (hereafter, referred to as $Ar^+$) (RF cleaning) so as to remove the oxide layer on the surface of the opened wafer, a TiN film 110 with the film thickness of, for example, 20 nm as an adherent layer by, for example, spattering. After that, a W film 111 with the film thickness of, for example, 300–500 nm is formed by CVD method in order to fill in the through hole, and the W film and TiN film which do not fill in the though hole are removed by, for example, CMP method.

Figure 2C:
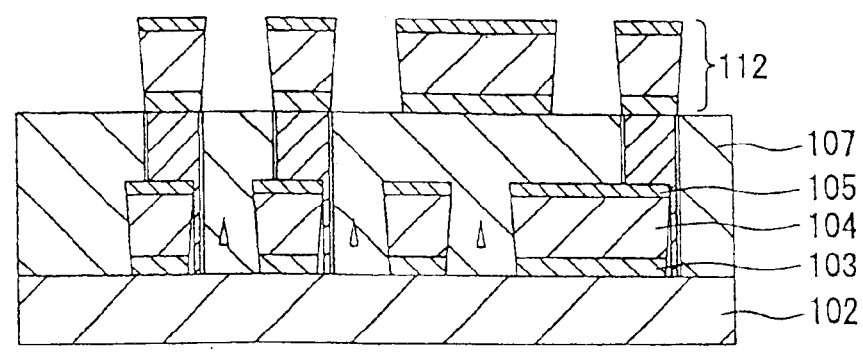

Finally as shown in FIG. 2(c), an upper layer interconnection 112 is formed by the same method as the one to form the lower layer interconnection.

A multi-layer interconnection is formed by repeating the above steps.

In this embodiment, since the lower layer interconnection is formed in an inverse tapered shape, a through hole is formed with the sidewall of the lower layer interconnection covered with the layer insulating film. Consequently, an etching gas can be prevented from reacting at the sidewall of the lower layer interconnection and especially the resistance at a shallow through hole formed with a fine pitch can be prevented from being made high.

Second Embodiment

A method for manufacturing a semiconductor device in the second embodiment will be explained in reference to FIGS. 3 and 4. It is to be noted that FIGS. 3 and 4 are sectional process charts showing a method for manufacturing a semiconductor device in the second embodiment.

Figure 3A:
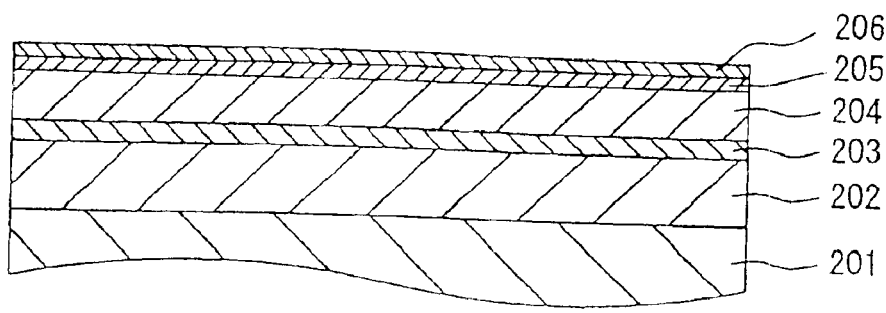
FIGS. 3(a)–3(c) are sectional process charts showing a method for manufacturing a semiconductor device in the second embodiment.

First, as shown in FIG. 3(a), after a silicon oxide film 202 is formed on a semiconductor substrate 201 on which a transistor (not shown), for example, is formed, a first laminated film 203 composed of a Ti film with the film thickness of, for example, 20 nm and a TiN film with the film thickness of, for example, 20 nm, an Al—Cu alloy film 204 with the film thickness of, for example, 400 nm, a Ti film 205 with the film thickness of, for example, 5 nm and a TiN film 206 with the film thickness of, for example, 50 nm, are formed in order by spattering. And a lower layer interconnection is formed.

Figure 3B:
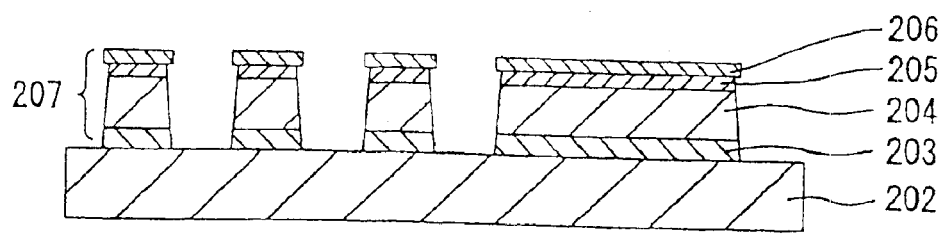

The sidewall of the lower layer interconnection is processed to take an eaves shape by patterning of, for example, photolithography or etching method as shown in FIG. 3(b). In other words, the TiN film 206 is processed to take an eaves shape projecting beyond the Al—Cu alloy film 204 by etching on the condition that an etching speed of TiN is higher than that of Al (for example, etching selectivity 5–10), and a lower layer interconnection 207 is formed. At this time, if the TiN film 206 has a width more than that of the lower layer, the lower layer 203 and 204 of the TiN film may take any of the shapes of rectangle, forward tapered and inverse tapered.

Figure 3C:
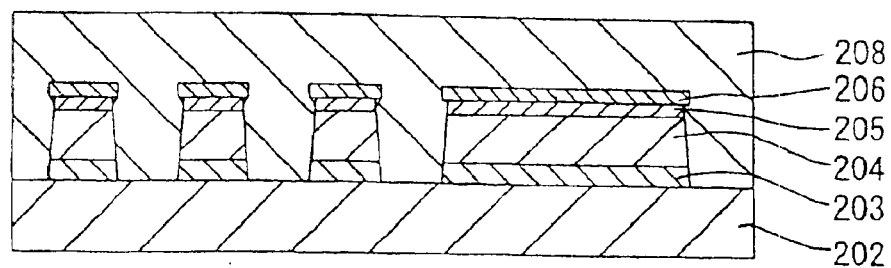

Next, as shown in FIG. 3(c), after a layer insulating film 208 composed of, for example, silicon oxide film is formed by high-density plasma CVD method, the surface of the layer insulating film 208 is flattened by, for example, CMP method.

At this time, even though the layer insulating film 208 is formed by high-density plasma CVD method, a void possibly remains right under the eaves-shaped part of the TiN film. However, this does not matter so much since the void does not become longer than the eaves-shaped part.

Figure 4A:
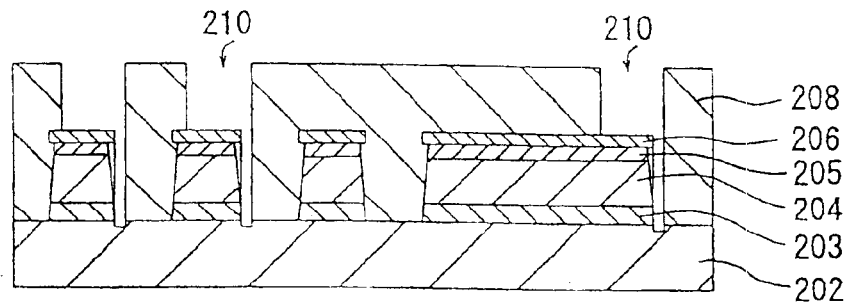
FIGS. 4(a)–4(c) are sectional process charts showing a method for manufacturing a semiconductor device in the second embodiment.

Further as shown in FIG. 4(a), a through hole 210 is formed on the layer insulating film 208 by photolithography method or anisotrophic etching method in which an etching gas composed of, for example, $CF_4$, $O_2$ and Ar so as to open the upper surface of the lower layer interconnection and a specific region on the side thereof. At this time, although the through hole is formed by over-etching as in the first embodiment, the TiN film 206 formed at the bottom of the through hole is made to remain.

In this embodiment, since the sidewall of interconnection is not exposed in forming a through hole, a reaction product is not generated by reacting the etching gas at the sidewall of interconnection.

Figure 4B:
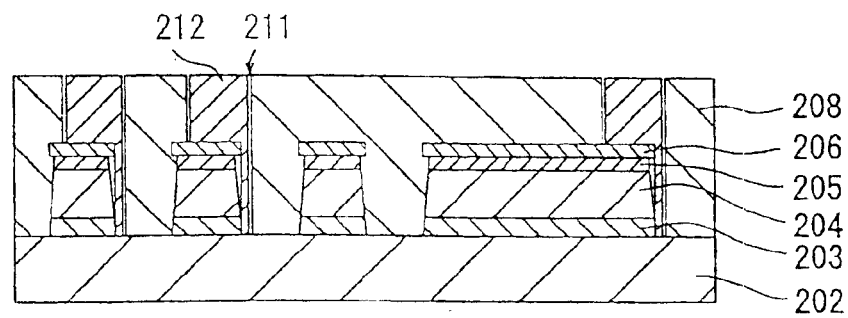

Furthermore as shown in FIG. 4(b), after the bottom of the through hole is cleaned by, for example, RF cleaning, a TiN film 211 with the film thickness of, for example, 20 nm as an adherent layer by, for example, spattering. After that, a W film 212 with the film thickness of, for example, 300–500 nm is formed by, for example, CVD method in order to fill in the through hole, and the W film and TiN film which do not fill in the though hole are removed by, for example, CMP method.

Figure 4C:
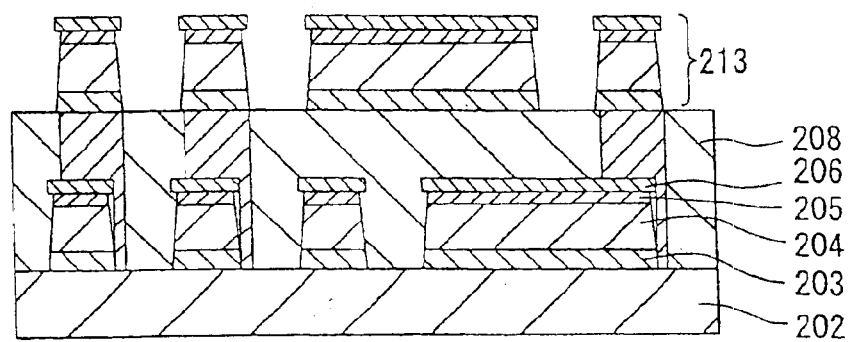

Finally as shown in FIG. 4(c), an upper layer interconnection 213 is formed by the same method as the one to form the lower layer interconnection.

A multi-layer interconnection is formed by repeating the above steps.

In this embodiment, since a TiN film is formed on the lower layer interconnection in a eaves shape, a through hole can be formed with the sidewall of the lower layer interconnection covered with the layer insulating film. Consequently, an etching gas can be prevented from reacting at the sidewall of the lower layer interconnection and especially the resistance at a shallow through hole can be prevented from being made high. Also in this embodiment, since the lower layer can be formed in an arbitrary shape, the etching control becomes facilitated, compared to the first embodiment.

Third Embodiment

A method for manufacturing a semiconductor device in the third embodiment will be explained in reference to FIGS. 5 and 6. It is to be noted that FIGS. 5 and 6 are sectional process charts showing a method for manufacturing a semiconductor device in the third embodiment.

Figure 5A:
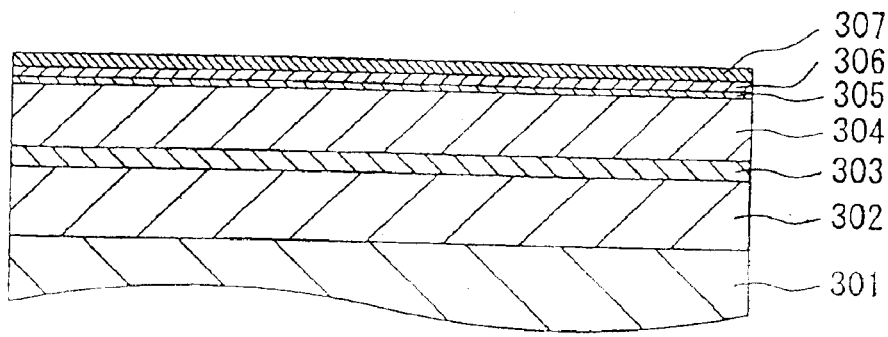
FIGS. 5(a)–5(c) are sectional process charts showing a method for manufacturing a semiconductor device in the third embodiment.

First, as shown in FIG. 5(a), after a silicon oxide film 302 is formed on a semiconductor substrate 301 on which a transistor (not shown), for example, is formed, a first laminated film 303 composed of a Ti film with the film thickness of, for example, 20 nm and a TiN film with the film thickness of, for example, 20 nm, an Al—Cu alloy film 304 with the film thickness of, for example, 400 nm, and a second laminated film composed of, for example, a Ti film 305 with the film thickness of, for example, 5 nm and a TiN film 306 with the film thickness of, for example, 50 nm, are formed in order by, for example, spattering. And a lower layer interconnection is formed. After that, differently from above embodiments, a silicon nitride film 307 with the film thickness of, for example, 50 nm is formed by plasma CVD method.

Figure 5B:
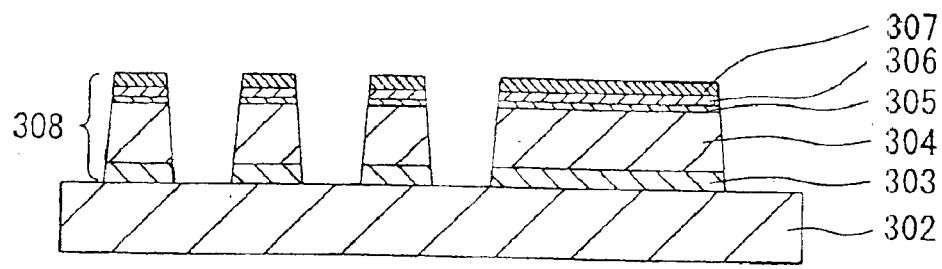

The silicon nitride film 307 is patterned by etching of, for example, photolithography or RIE method as shown in FIG. 5(b). And a lower layer interconnection 303, 304, 305 and 306 are processed by etching in a forward tapered shape and by using the patterned silicon nitride film 307 as a mask to form a lower layer interconnection 308. At this time, the lower layer interconnection may take any of the shapes of rectangle, forward tapered and inverse tapered.

Figure 5C:
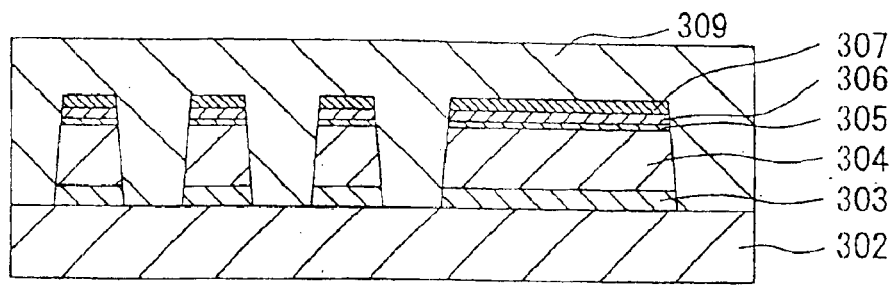

Next, as shown in FIG. 5(c), after a layer insulating film 309 composed of, for example, silicon oxide film is formed by high-density plasma CVD method, the surface of the layer insulating film 309 is flattened by, for example, CMP method.

Figure 6A:
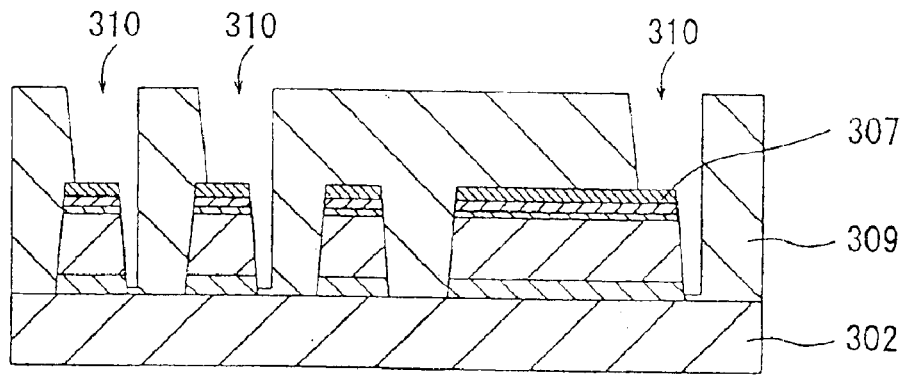
FIGS. 6(a)–6(c) are sectional process charts showing a method for manufacturing a semiconductor device in the third embodiment.

Further as shown in FIG. 6(a), a through hole 310 is formed on the layer insulating film 309 by photolithography method or anisotrophic etching method in which an etching gas composed of, for example, $CF_4$, $O_2$ and Ar so as to open the upper surface of the lower layer interconnection and a specific region on the side thereof. At this time, a resist is removed and washed after the over-etching is performed in a necessary amount.

Figure 6B:
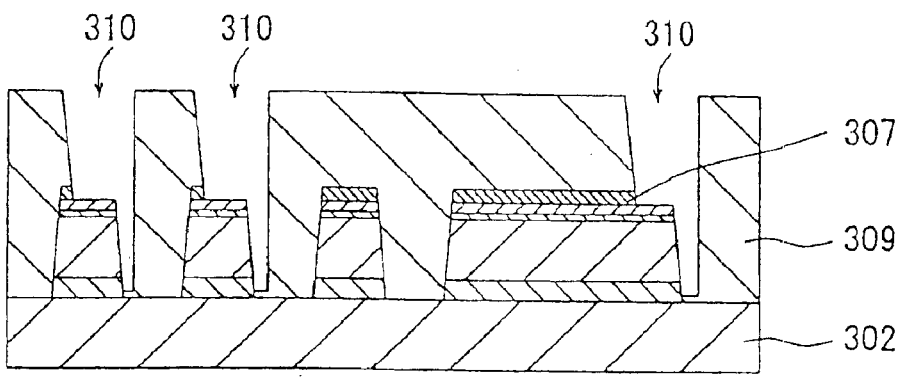

And then as shown in FIG. 6(b), the silicon nitride film 307 located on the lower layer interconnection and exposed inside the through hole is removed by etching. Thereby the reaction product accumulating on the silicon nitride film can be removed at the same time.

Figure 6C:
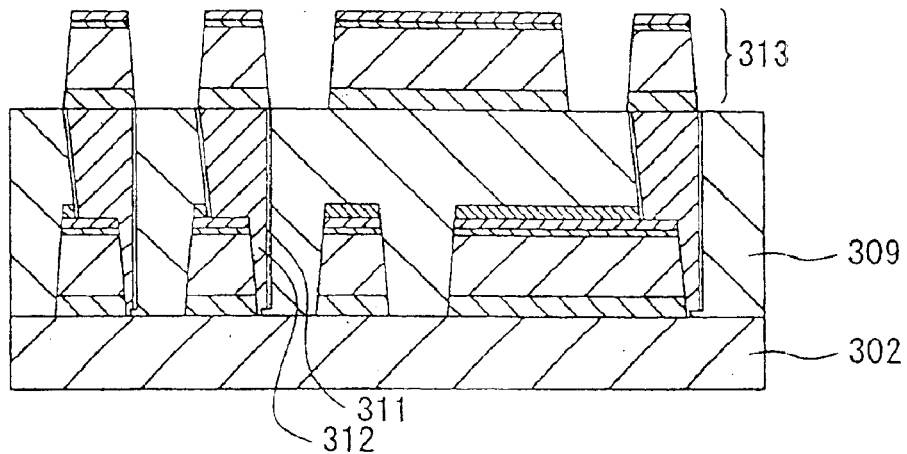

Furthermore as shown in FIG. 6(c), after the bottom of the through hole is cleaned by, for example, spatter-etching, a TiN film 311 with the film thickness of, for example, 20 nm as an adherent layer by, for example, spattering. After that, a W film 312 with the film thickness of, for example, 300–500 nm is formed by, for example, CVD method in order to fill in the through hole, and the W film and TiN film which do not fill in the though hole are removed by, for example, CMP method. Finally, an upper layer interconnection 313 is formed by the same method as the one to form the lower layer interconnection.

A multi-layer interconnection is formed by repeating the above steps.

In this embodiment, since the upper part of the lower layer interconnection is covered with a dense silicon nitride film, the reaction product does not spread the silicon nitride film even if the reaction product generated during over-etching the through hole accumulates on a silicon nitride film. As a result, the resistances at the TiN film and the Ti film at the interface of TiN/Al can be prevented from being made high. Also, since the silicon nitride film can be removed in a short time and the TiN film is not exposed on the over-etching gas, especially the resistance at a shallow through hole can be prevented from being made high.

Also, since the lower layer can be formed in an arbitrary shape, the shape control becomes facilitated. Moreover, since the lower layer interconnection can be formed in a rectangle shape or a forward tapered shape, a void can be prevented from generating at the layer insulating film between lower layer interconnection s.

Fourth Embodiment

A method for manufacturing a semiconductor device in the fourth embodiment will be explained in reference to FIGS. 7 and 8. It is to be noted that FIGS. 7 and 8 are sectional process charts showing a method for manufacturing a semiconductor device in the fourth embodiment.

Figure 7A:
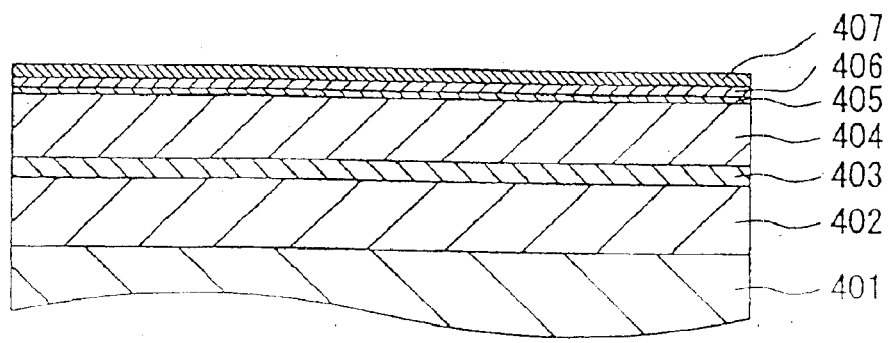
FIGS. 7(a)–7(c) are sectional process charts showing a method for manufacturing a semiconductor device in the fourth embodiment.

First, as shown in FIG. 7(a), after a silicon oxide film 402 is formed on a semiconductor substrate 401 on which a transistor (not shown), for example, is formed by plasma CVD method in which silane (hereafter, referred to as $SiH_4$)+oxygen (hereafter, referred to as $O_2$) gas, for example, is used, a first laminated film 403 composed of a Ti film with the film thickness of, for example, 20 nm and a TiN film with the film thickness of, for example, 20 nm, an Al—Cu alloy film 404 with the film thickness of, for example, 400 nm, a Ti film 405 with the film thickness of, for example, 5 nm and a TiN film 406 with the film thickness of, for example, 50 nm, are formed in order by, for example, spattering. And a lower layer interconnection is formed. After that, differently from above embodiments, a silicon-rich oxide film 407 containing more Si than a normal silicon oxide film is formed with the film thickness of, for example, 100 nm. It is to be noted that the silicon oxide film 407 is formed on the condition that the flow ratio of silane and oxide gas during film formation is expressed by, for example, $SiH_4/(SiH_4+O_2) \geq 0.34$.

Figure 7B:
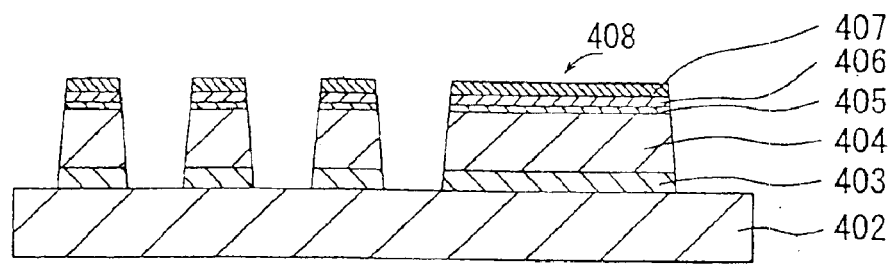

The silicon nitride film 407 is patterned by, for example, photolithography or etching method as shown in FIG. 7(b). And a lower layer interconnection 403, 404, 405 and 406 are processed by etching and by using the patterned silicon-rich nitride film 407 as a mask to form a lower layer interconnection 406. At this time, the lower layer interconnection may take any of the shapes of rectangle, forward tapered and inverse tapered.

Figure 7C:
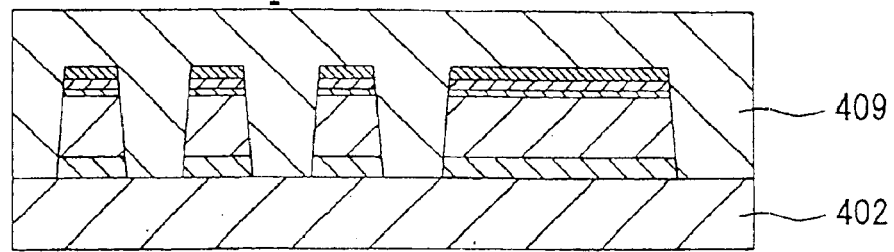

Next, as shown in FIG. 7(c), after a layer insulating film 409 composed of, for example, silicon oxide film or fluorine (hereafter, referred to as F)-doped silicon oxide film is formed by high-density plasma CVD method, the surface of the layer insulating film 409 is flattened by, for example, CMP method.

Figure 8A:
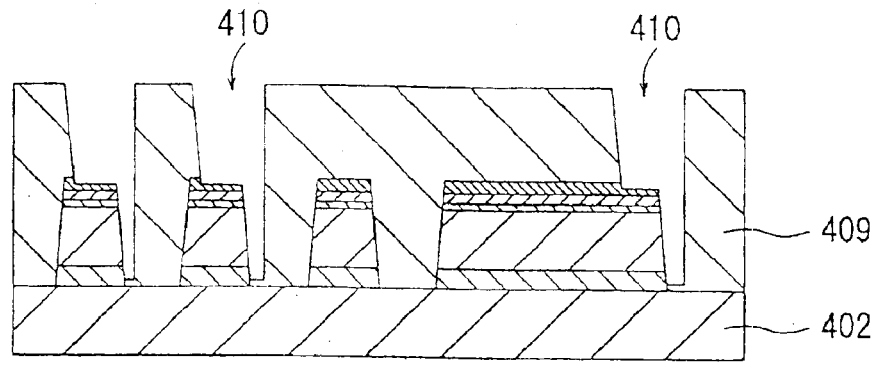
FIGS. 8(a)–8(c) are sectional process charts showing a method for manufacturing a semiconductor device in the fourth embodiment.

Further as shown in FIG. 8(a), a through hole 410 is formed on the layer insulating film 409 by photolithography method or anisotrophic etching method in which an etching gas composed of, for example, $CF_4$, $O_2$ and Ar so as to open the upper surface of the lower layer interconnection and a specific region on the side thereof. At this time, the through hole is etched on the normal etching condition (using $CF_4/O_2$/Ar gas). However, since the etching rate of silicon-rich oxide film is slower than that of normal oxide film, the silicon-rich oxide film 407 remains slightly on the upper part of the interconnection or is removed not to over-etch the through hole even if enough amount of over-etching is performed. In addition, the silicon-rich oxide film remains at the bottom of a deep through hole.

Figure 8B:
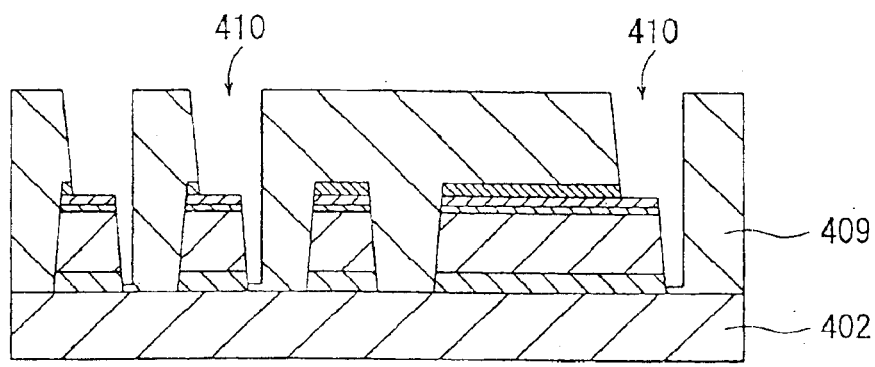

And then as shown in FIG. 8(b), the silicon-rich oxide film remaining at the bottom of the through hole is removed on the condition of an oxygen (hereafter, referred to as $O_2$) plasma made intense. Thereby the reaction product accumulating on the silicon-rich oxide film can be removed at the same time.

Figure 8C:
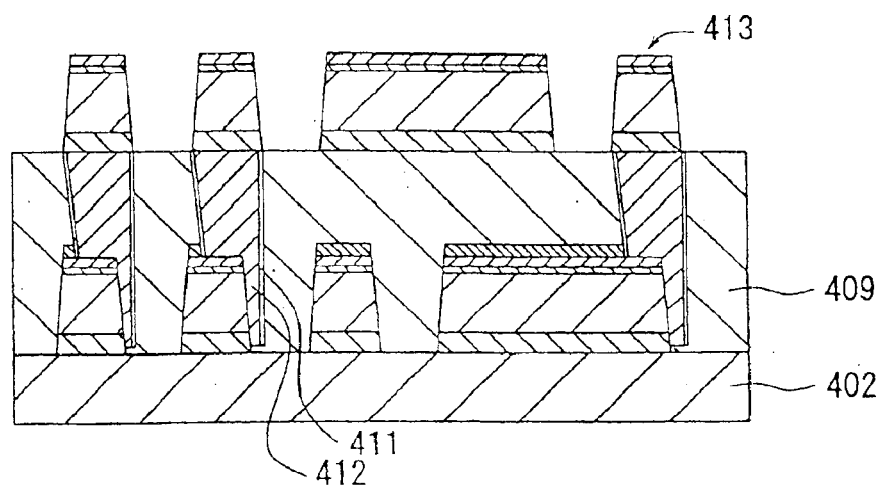

Furthermore as shown in FIG. 8(c), after the bottom of the through hole is cleaned by, for example, spatter-etching, a TiN film 411 with the film thickness of, for example, 20 nm as an adherent layer by, for example, spattering. After that, a W film 412 with the film thickness of, for example, 300–500 nm is formed by, for example, CVD method in order to fill in the through hole, and the W film and TiN film which do not fill in the though hole are removed by, for example, CMP method. Finally, an upper layer interconnection 413 is formed by the same method as the one to form the lower layer interconnection.

A multi-layer interconnection is formed by repeating the above steps.

In this embodiment, since the upper part of the lower layer interconnection is covered with a silicon-rich oxide film, the reaction product is generated on the silicon-rich oxide film during over-etching the through hole. As described above, since the reaction product does not spread the silicon-rich oxide film, the resistances at the TiN film and the Ti film at the interface of TiN/Al can be prevented from being made high. Also, since only the silicon-rich oxide film can be removed in a short time, the TiN film on the lower layer interconnection is not exposed on the over-etching gas. As a result, especially the resistance at a shallow through hole formed with a fine pitch can be prevented from being made high.

Also, although the dielectric constant of a silicon-rich oxide film is a little higher than that of a normal silicon oxide film, the dielectric constant of a silicon-rich oxide film is lower than that of a silicon nitride film by roughly 25%. Consequently, the delay of the lower layer interconnection caused by the capacity increase of the layer insulating film can be prevented comparing to the one occurred in the third embodiment.

Furthermore, since the silicon-rich oxide film has a high capability of preventing fluorine from spreading on a F-doped silicon oxide film which is a layer insulating film with a low capacity, the adhesion property of F-doped silicon oxide film with the lower layer interconnection becomes good when used as a layer insulating film. It is to be noted that since the F-doped silicon oxide film contains free fluorine a film-peeling is caused by the free fluorine in a heat treatment step implemented later. When the F-doped silicon oxide film is used in the step, the free fluorine can be trapped by using the F-doped silicon oxide film in a pair.

Fifth Embodiment

A method for manufacturing a semiconductor device in the fifth embodiment will be explained in reference to FIGS. 9 and 10. It is to be noted that FIGS. 9 and 10 are sectional process charts showing a method for manufacturing a semiconductor device in the fifth embodiment.

Figure 9A:
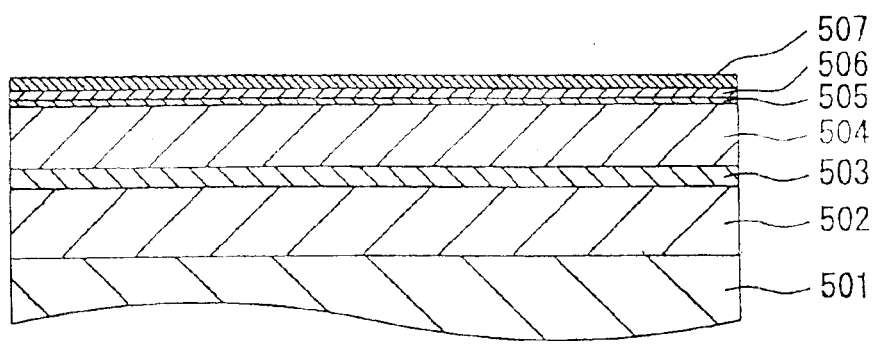
FIGS. 9(a) and 9(b) are sectional process charts showing a method for manufacturing a semiconductor device in the fifth embodiment.

First, as shown in FIG. 9(a), after a silicon oxide film 502 is formed on a semiconductor substrate 501 on which a transistor (not shown), for example, is formed, a first laminated film 503 composed of a Ti film with the film thickness of, for example, 20 nm and a TiN film with the film thickness of, for example, 20 nm, an Al—Cu alloy film 504 with the film thickness of, for example, 400 nm, a Ti film 505 with the film thickness of, for example, 5 nm, a TiN film 506 with the film thickness of, for example, 50 nm and an Al—Cu alloy film 507 with the film thickness of, for example, 10 nm, are formed in order by, for example, spattering. And a lower layer interconnection is formed.

It is to be noted that although an Al—Cu alloy is adopted in this embodiment an Al—aluminum alloy such as Al—Si—Cu and Al—Si can be also adopted.

Figure 9B:
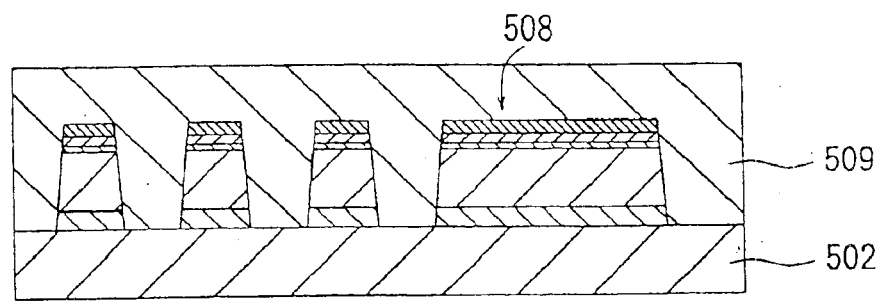

Patterning is performed by, for example, photolithography or etching method as shown in FIG. 9(b). And a lower layer interconnection 508 is formed. Next, after a layer insulating film 509 composed of, for example, silicon oxide film is formed by high-density plasma CVD method, the surface of the layer insulating film 509 is flattened by, for example, CMP method.

Figure 10A:
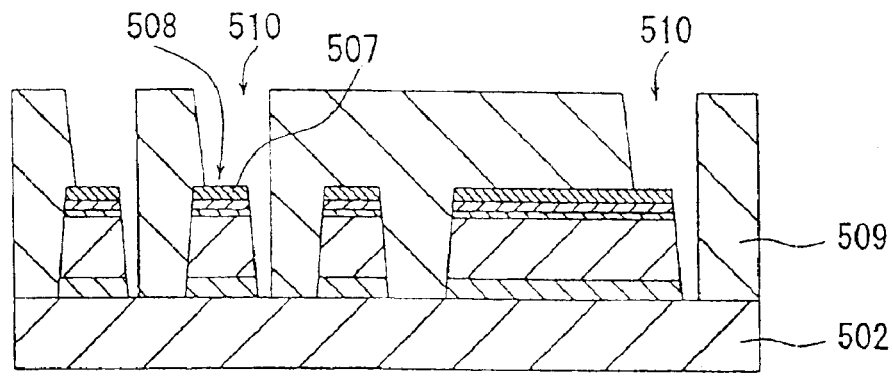
FIGS. 10(a)–10(c) are sectional process charts showing a method for manufacturing a semiconductor device in the fifth embodiment.

Further as shown in FIG. 10(a), a through hole 510 is formed on the layer insulating film 509 by photolithography method or anisotrophic etching method in which an etching gas composed of, for example, $CF_4$, $O_2$ and Ar so as to open the upper surface of the lower layer interconnection and a specific region on the side thereof. At this time, a resist is removed and washed after the over-etching is performed in a necessary amount.

Figure 10B:
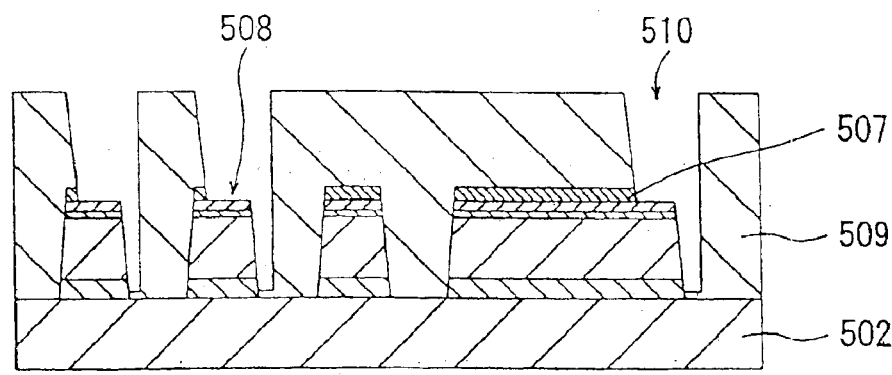

And then as shown in FIG. 10(b), the Al—Cu alloy film 507 exposed at the bottom of the through hole 510 is removed by etching with a metal-etching condition in which chlorine-based(hereafter, referred to as $Cl_2$-based) gas ($Cl_2$ or $BCl_3$) is used. Thereby the reaction product accumulating on the Al—Cu alloy film can be removed at the same time. It is to be noted that it is not necessary to remove the Al—Cu alloy film completely if etching is performed in an enough amount to remove the reaction product.

Figure 10C:
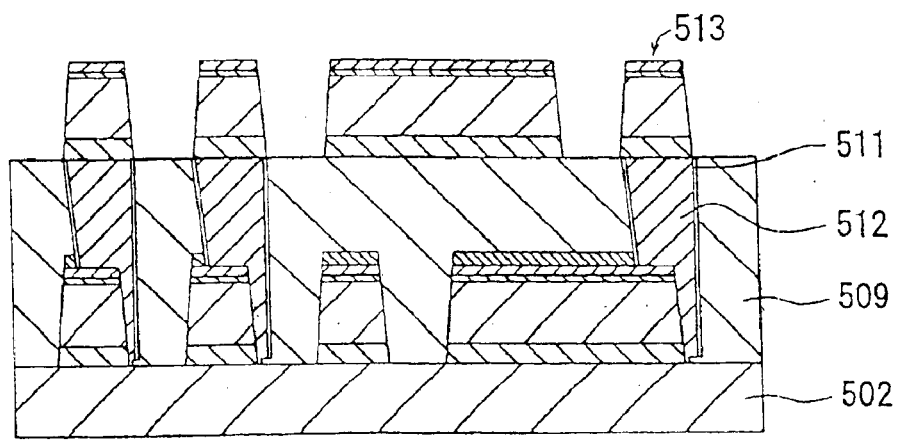
Figure 11A:
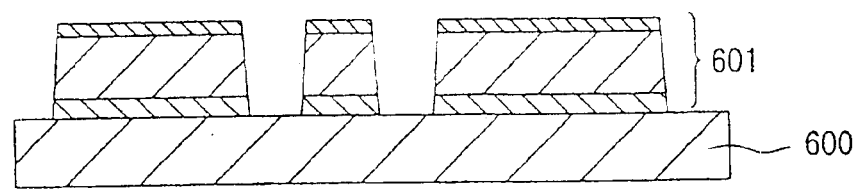
FIGS. 11(a)–11(c) are sectional process charts showing a conventional method for manufacturing a semiconductor device.
Figure 11B:
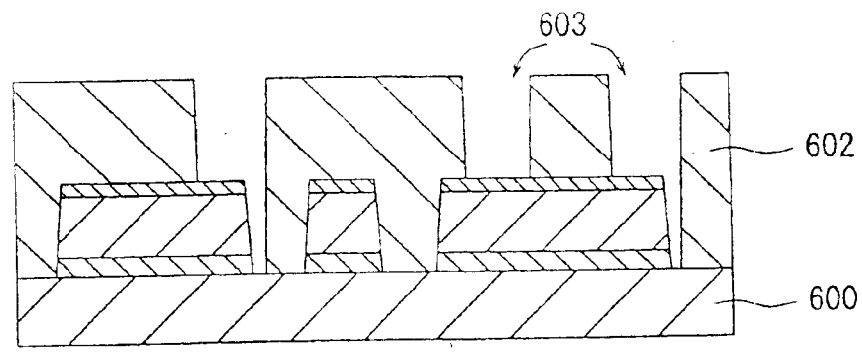
Figure 11C:
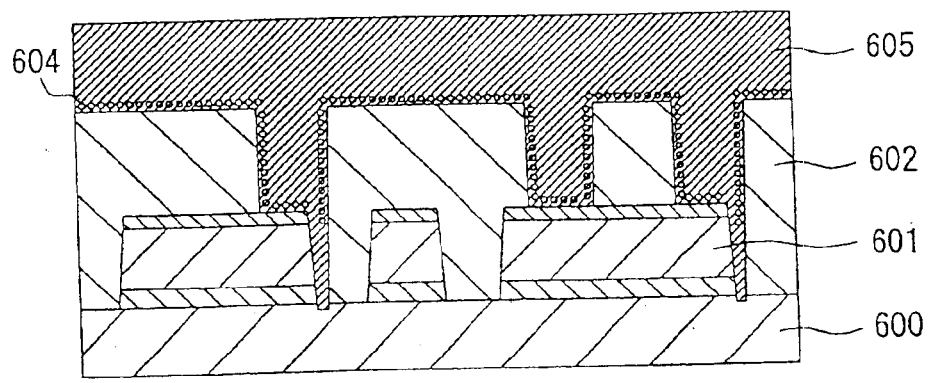
Figure 12A:
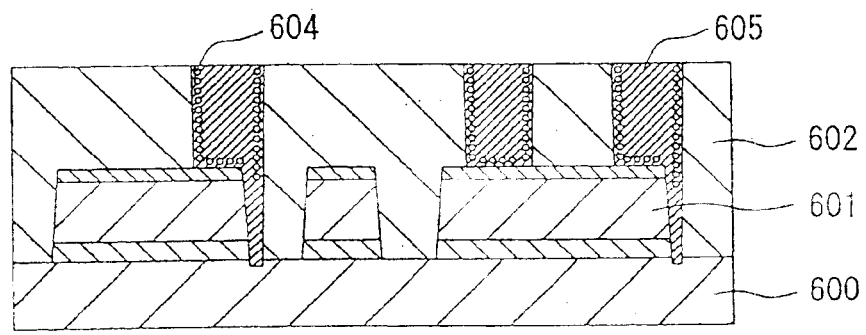
FIGS. 12(a) and 12(b) are sectional process charts showing a conventional method for manufacturing a semiconductor device.
Figure 12B:
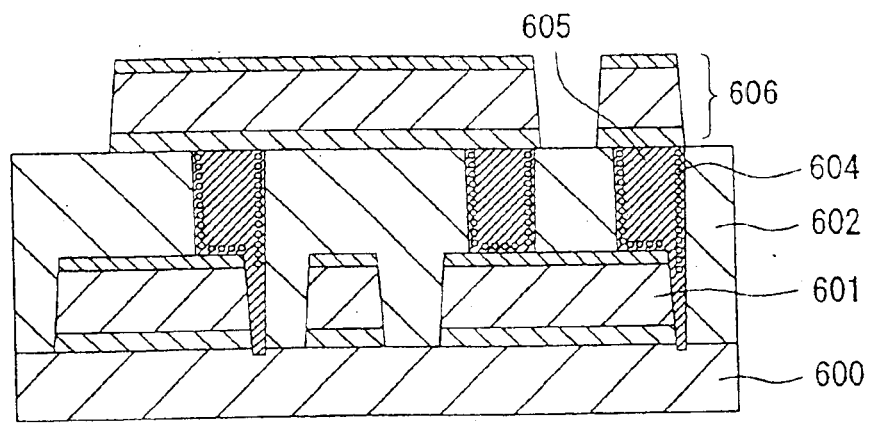
Figure 13:
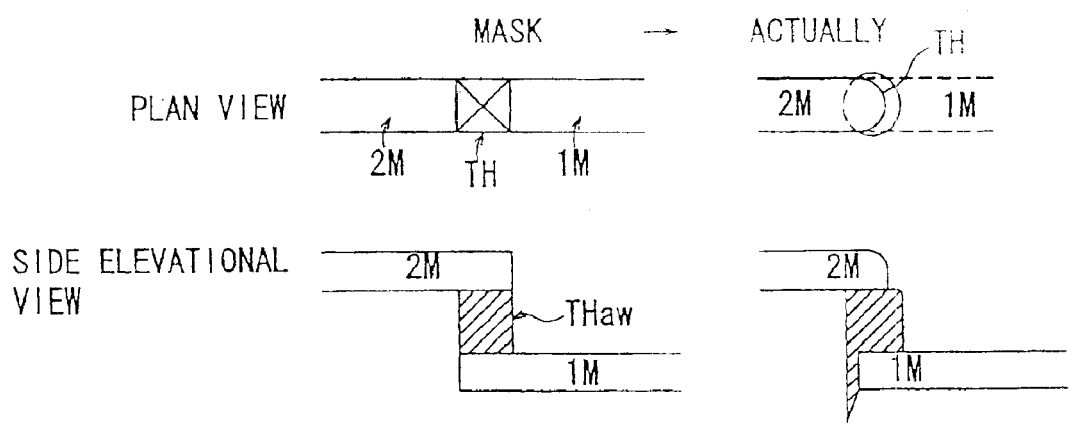
FIG. 13 shows a conventional through hole formed outside of a lower layer interconnection.
Figure 14:
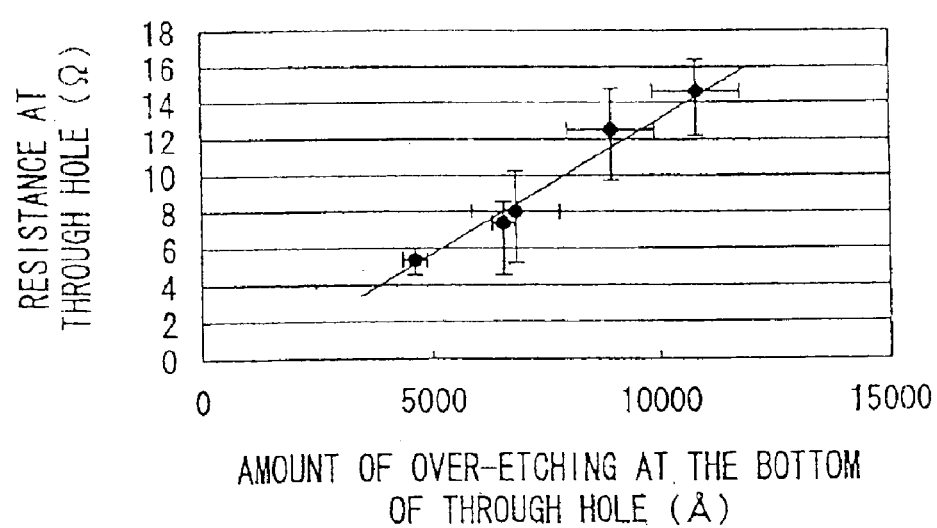
FIG. 14 is a graphical representation showing a conventional relation between the amount of over-etching at the bottom of a through hole and the resistance at the through hole.

Furthermore as shown in FIG. 10(c), after the bottom of the through hole is cleaned by, for example, spatter-etching, a TiN film or TiN/Ti laminated film 511 with the film thickness of, for example, 20 nm as an adherent layer is formed, for example, by spattering.

In addition, a single layer of TiN can be used in forming an adherent layer on a TiN film, however, aluminum nitride may be formed as the aluminum is nitrided in forming an adherent layer consisting of the single layer of TiN on Al. Therefore, it is preferable to use a TiN/Ti laminated film when Al may remain at the bottom of through hole.

After that, a W film 512 with the film thickness of, for example, 300–500 nm is formed by CVD method in order to fill in the through hole, and the W film and TiN film which do not fill in the though hole are removed by, for example, CMP method. Finally, an upper layer interconnection 513 is formed by the same method as the one to form the lower layer interconnection.

A multi-layer interconnection is formed by repeating the above steps.

In this embodiment, since the upper part of the lower layer interconnection is covered with a dense Al—Cu film, the reaction product generated during over-etching the through hole is accumulated on the Al—Cu film. Since the reaction product does not spread the dense Al—Cu film, the resistances at the TiN film and the Ti film at the interface of TiN/Al can be prevented from being made high. Also, since the Al—Cu film on which the reaction product (non-conductive substance) is accumulated can be removed in a short time, the TiN film is not exposed on the over-etching gas. As a result, especially the resistance at a shallow through hole can be prevented from being made high. Moreover, since the Al—Cu layer also functions as a lower layer interconnection and the layer insulating film with a low dielectric constant used conventionally can be used in this embodiment without changing its structure, a interconnection with high performance can be obtained. As described above, since silicon nitride (hereafter, referred to as SiN) with a high dielectric constant is not used, there is no concern about the dielectric constant of the layer insulating film to obtain a interconnection with high performance.

Still further, since a layer consisting of an aluminum-based alloy is formed on the upper side of the lower layer interconnection, there can be prevented various kind of gasses such as nitride-based gas generated by reacting a TiN film, for example, accumulating on the surface of the layer with an etching gas and carbon-based gas generated by etching a resist and a reaction product from spreading into the interconnection even if the film thickness of the layer is thin, for example, 10 nm. Also, since a layer consisting of an aluminum-based alloy is formed with a thin film thickness, an aluminum alloy-based layer on which the reaction product is accumulated can be removed in an extremely short time. Therefore, etching does not make an effect on the lower layer.

Next, a technical philosophy other than the claim paragraph, which can be understood according to the embodiment of this invention, are described with the effect.

There is provided a semiconductor device forming a first interconnection formed on the surface of a first layer insulating film and a second interconnection provided on the upper part of the first interconnection and electrically connected to the first interconnection, and wherein the first interconnection is formed so that the width of the lower part may become narrower than that of the upper part. In this invention, since the first interconnection is formed so that the width of the lower part may become narrower than that of the upper part, a through hole is formed with the sidewall of the lower layer interconnection covered with the layer insulating film. Consequently, an etching gas can be prevented from reacting at the sidewall of the lower layer interconnection and especially the resistance at a shallow through hole formed with a fine pitch can be prevented from being made high.

Furthermore, it is preferable that the shape of the first interconnection becomes incurved from the upper part to the lower part. In this structure, an etching gas can be prevented from reacting at the sidewall of the lower layer interconnection and especially the resistance at a shallow through hole formed with a fine pitch can be prevented from being made high.

Moreover, it is preferable that the taper angle of the sidewall of the first interconnection is 86–88 degrees in order to obtain the effect of the present invention.

Still further, it is preferable that the first interconnection is electrically connected to the second interconnection through a through hole. In this structure, a semiconductor device capable of forming a fine interconnection structure without making the resistance at the through hole high is to provided.

Although the preferred embodiment of the present invention has been described referring to the accompanying drawings, the present invention is not restricted to such examples. It is evident to those skilled in the art that the present invention may be modified or changed within a technical philosophy thereof and it is understood that naturally these belong to the technical philosophy of the present invention.

This embodiment, for example, has been explained by referring to an example that a through hole is opened at the sidewall in an extending direction of interconnection, however, this invention can be also achieved in the case that a through hole is formed at the end part of interconnection.

Since the sidewall part of the lower layer interconnection is not exposed on an etching gas, an unnecessary reaction product can be prevented from forming at the sidewall of the lower layer interconnection. As a result, the resistance at a shallow through hole formed with a fine pitch can be prevented from being made high.

What is claimed is:

1. A method for manufacturing a semiconductor device, comprising:

forming a first interconnection layer having a top surface and a bottom surface on an insulating film, wherein the first interconnection layer comprises a laminated film and wherein a top film of the first interconnection layer is a silicon nitride film;

etching the first interconnection layer to form a tapered structure, wherein a width of a bottom surface of the etched first interconnection layer is larger than a width of a top surface of the etched first interconnection layer;

forming an interlayer insulation film on the etched first interconnection layer;

etching a part of the interlayer insulation film by an anisotropic etching to expose the silicon nitride film at the top surface of the etched first interconnection layer and to expose a sidewall surface of the etched first interconnection layer;

etching the exposed silicon nitride film to remove a reaction product thereon;

forming a TiN film on the etched first interconnection layer after removal of the reaction product;

forming a tungsten film on the TiN film; and forming a second interconnection layer comprising another laminated film on the tungsten film.

2. A method of manufacturing a semiconductor device according to claim 1, wherein said etching a part of the interlayer insulation film comprises using an etching gas of $CF_4$, $O_2$ and Ar.

* * * * *